United States Patent
Hill et al.

(10) Patent No.: US 7,078,109 B2
(45) Date of Patent: Jul. 18, 2006

(54) HEAT SPREADING THERMAL INTERFACE STRUCTURE

(75) Inventors: Richard Hill, Parkman, OH (US); Jason Strader, Cleveland, OH (US); James Latham, Lakewood, OH (US)

(73) Assignee: Thermagon Inc., Cleveland, OH (US)

( * ) Notice: Subject to any disclaimer, the term of this patent is extended or adjusted under 35 U.S.C. 154(b) by 56 days.

(21) Appl. No.: 10/886,841

(22) Filed: Jul. 7, 2004

(65) Prior Publication Data

US 2005/0045372 A1 Mar. 3, 2005

Related U.S. Application Data

(60) Continuation-in-part of application No. 10/090,540, filed on Mar. 1, 2002, now Pat. No. 6,761,928, which is a division of application No. 09/513,483, filed on Feb. 25, 2000, now Pat. No. 6,372,997.

(51) Int. Cl.
*H01L 23/40* (2006.01)
*H01L 23/42* (2006.01)
*B32B 3/02* (2006.01)
*B32B 7/04* (2006.01)
*B32B 15/01* (2006.01)

(52) U.S. Cl. ............... 428/620; 428/601; 428/614; 428/624; 438/117; 228/179.1

(58) Field of Classification Search ........... 428/601, 428/614, 620, 624, 650, 674; 438/106, 118, 438/763, 117; 228/179.1, 262.1
See application file for complete search history.

(56) References Cited

U.S. PATENT DOCUMENTS

| | | | | |
|---|---|---|---|---|
| 5,591,034 A | * | 1/1997 | Ameen et al. | 439/91 |
| 6,391,442 B1 | * | 5/2002 | Duvall et al. | 428/348 |
| 6,496,373 B1 | * | 12/2002 | Chung | 361/705 |
| 6,617,517 B1 | * | 9/2003 | Hill et al. | 174/252 |
| 6,632,704 B1 | * | 10/2003 | Kumamoto et al. | 438/106 |
| 6,653,741 B1 | * | 11/2003 | Sreeram et al. | 257/781 |
| 6,706,562 B1 | * | 3/2004 | Mahajan et al. | 438/125 |
| 6,757,170 B1 | * | 6/2004 | Lee et al. | 361/704 |
| 6,776,923 B1 | * | 8/2004 | Balian et al. | 252/71 |
| 6,835,453 B1 | * | 12/2004 | Greenwood et al. | 428/343 |
| 6,867,978 B1 | * | 3/2005 | Whittenburg et al. | 361/719 |
| 2003/0153667 A1 | * | 8/2003 | Jayaraman et al. | 524/432 |
| 2005/0045855 A1 | * | 3/2005 | Tonapi et al. | 252/500 |

* cited by examiner

*Primary Examiner*—Deborah Jones
*Assistant Examiner*—Jason L. Savage

(57) ABSTRACT

The thermal interface structure of the present invention is suited for use in a non-referenced die system between a heat source and heat sink spaced up to 300 mils apart and comprises a plurality of layers including a core body of high conductivity metal or metal alloy having opposite sides, a soft thermal interface layer disposed on one side of the core body for mounting against the heat sink and a thin layer of a phase change material disposed on the opposite side of the core body for mounting against the heat source wherein the surface area dimension (footprint) of the core body is substantially larger than the surface area of the heat source upon which the phase change material is mounted to minimize the thermal resistance between the heat source and the heat sink and wherein said soft thermal interface layer is of a thickness sufficient to accommodate a variable spacing between the heat source and the heat sink of up to 300 mils.

8 Claims, 1 Drawing Sheet

HEAT SPREADING THERMAL INTERFACE STRUCTURE

FIELD OF INVENTION

This invention is a continuation in part of U.S. Ser. No. 10/090,540 filed on Mar. 1, 2002 now U.S. Pat. No. 6,761,928 which, in turn, is a division of U.S. patent application Ser. No. 09/513,483 filed Feb. 25, 2000 now U.S. Pat. No. 6,372,997 and relates to thermal interface material structures of multilayer construction with at least one layer having phase change properties.

BACKGROUND

Improving heat transfer between sources of heat and associated heat removal hardware has become a critical limitation in many industries. One of those industries particularly affected is electronics, where miniaturization has significantly increased the heat flux required to maintain temperatures at low enough levels to prevent damage to electronic components. Common to many heat removal problems is the requirement to improve the thermal transfer between heat-generating components and heat removal hardware. Since the mating surfaces of these items are not perfectly flat, installation of a compliant material between them has become a common practice. The compliant material serves to fill the imperfections and gaps that are present, thereby removing air and substituting a material with higher thermal conductivity, resulting in improved heat transfer. These compliant thermal interface materials are commonly referred to as gap fillers.

Early technology made use of soft, thermally conductive, compliant gap fillers to improve thermal contact between materials. As a result, the thermal transfer improved between heat source components such as computer cpu's or gpu's, and the heat sink module used to remove heat. An improvement over this technology led to the introduction of materials that, when heated, soften or melt, allowing the material to re-arrange. If the mating surfaces are held together using pressure, the excess material is forced outside of the contact area, and the bond line becomes thinner, effectively reducing thermal resistance and allowing improved heat removal and lower temperature of the heat source. Such materials are generally referred to as phase change materials. Typical phase change materials used in the electronics industry consist of waxes and/or resins that are often filled with high thermal conductivity fillers to improve their thermal conductivity. An improvement over conventional phase change materials was developed recently through the use of low melting alloy phase change materials. An example of this is taught in applicants parent U.S. Pat. No. 6,372,997 the disclosure of which is incorporated herein by reference; describing, among other things, a three layer structure for placement between a heat source and heat sink, comprised of a low melting phase change alloy layer adhered on both sides to a copper core. Upon heating, the alloy melts on each mating surface to form a good thermal bond between the heat source and heat sink.

Miniaturization of electronic components and systems often presents difficulties in fitting heat removal systems into available space. In addition, in some situations both the heat source and the heat sink are in fixed positions with respect to the "system" but not with respect to each other hereinafter referred to as a "non-referenced die system" in which the distance between the heat sink and the heat source is a variable and can vary significantly (the "die" in this type of non-referenced system may represent an integrated circuit). In such situations it is impractical to use a thermal interface structure having a phase change layer on opposite sides of a metal core as taught in the aforementioned patent.

SUMMARY OF THE INVENTION

The thermal interface structure of the present invention is particularly suited for use in a non-referenced die system between a heat source and heat sink spaced up to 300 mils apart and comprises a plurality of layers including a core body of high conductivity metal or metal alloy having opposite sides, a soft thermal interface layer disposed on one side of the core body for mounting against the heat sink and a thin layer of a phase change material disposed on the opposite side of the core body for mounting against the heat source wherein the surface area dimension (footprint) of the core body is substantially larger than the surface area of the heat source upon which the phase change material is mounted to minimize the thermal resistance between the heat source and the heat sink and wherein said soft thermal interface layer is of a thickness sufficient to accommodate a variable spacing between the heat source and the heat sink of up to 300 mils. The soft thermal interface material is of a thickness and composition such that it will compress or be deflected when squeezed to accommodate the variable spacing between the heat source and heat sink.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
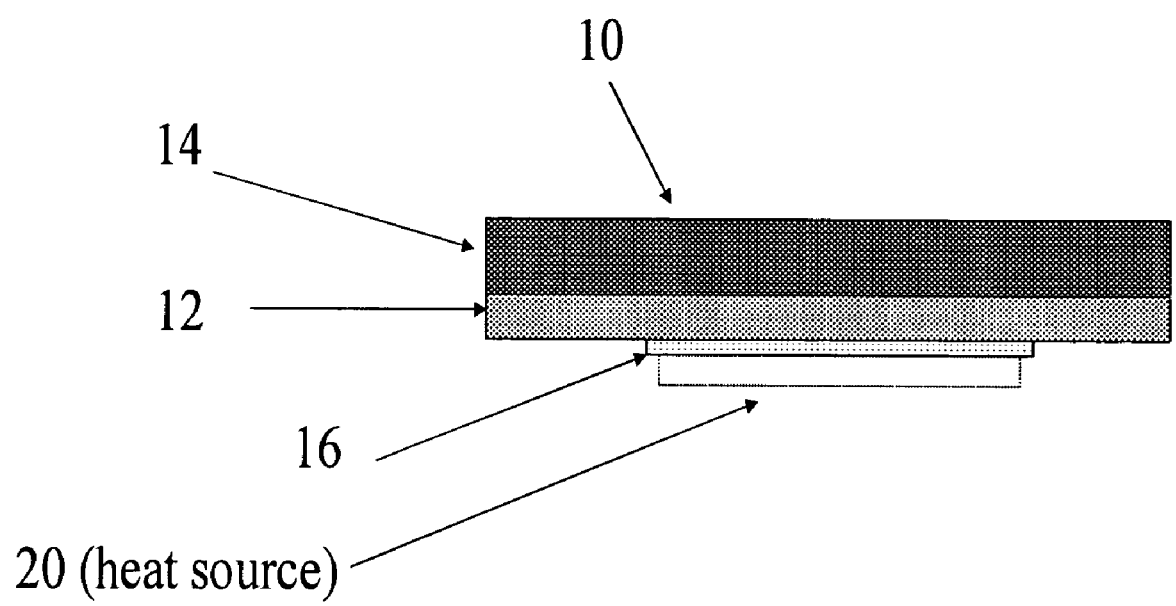
FIG. 1 is a cross sectional view of the thermal interface structure of the present invention shown mounted on a heat sink for which the thermal interface structure of the present invention is adapted.

The thermal interface structure 10 of the present invention is of a multilayer construction comprising a core 12 composed of high conductivity metal such as, for example, copper, or a composition of any high conductivity metal alloy and is of a configuration having opposite sides with a soft filler material 14 disposed on one side thereof and a phase change material 16 disposed on the opposite side. The soft filler material 14 is of a thickness sufficient to permit the thermal interface structure 10 to accommodate a variable spacing between a heat source 20 and a heat sink (not shown) of up to 300 mils.

The phase change material 16 is formed as a layer in the interface structure 10 having a surface 21 with a surface area which defines its footprint which is smaller than the surface area or footprint of the metallic core 12 and smaller than the corresponding footprint of the gap filler 14 each of which, as shown in FIG. 1, should be considerably larger in dimension than that of the surface area of the heat source 20 upon which the phase change layer 16 is mounted. However, the surface area of the phase change material 16 may be equal, larger or smaller than the surface area of the heat source 20. It is only the surface area of the core 12 and gap filler 14 which must be larger than the surface area of the heat source 20 against which the interface structure 10 is mounted to realize the benefits of the subject invention. The phase change material layer 16 can be composed from any low melting alloy composition or a thermally conductive polymer composition such as, for example, a wax filled with boron nitride particles.

The soft filler material composition 14 may be composed of any high thermal conductivity material composition which is compressible or deflectable when squeezed in order to allow for thickness tolerance differences between the heat source and heat sink An example of a suitable soft material commercially available from Thermagon Inc. of Cleveland Ohio identified as T-flex 600. Other suitable soft gap filler materials may be formed from a polymer filled with conventionally known thermally conductive filler powders such as boron nitride, aluminum oxide, aluminum, zinc oxide, or other known thermally conductive fillers.

The high conductivity metal or metal alloy core 12 may be selected from any of the transition elements of row 4 of the periodic table in addition to magnesium or aluminum or row 3 and their alloys. However, a foil sheet of copper or aluminum is preferred.

The layer of phase change material 16 minimizes the thermal contact resistance between the heat source 20 and the thermal interface structure 10 whereas the soft gap filler 14 accommodates for any variation in the spacing dimension between the heat source 20 and the heat sink (not shown) so that no air gap is formed therebetween. The layer of phase change material 16 should be thin and not exceed a thickness of 25 mils with a preferred thickness of less than 2 mils whereas the thickness of the soft gap layer 14 is considerably thicker and may have a thickness of up to 300 mils depending upon the spacing between the heat source and heat sink.

It is recognized that since the soft gap filler 14 has a thickness substantially larger than the thickness of the phase change material layer 16 the thermal resistance through the soft gap filler 14 must necessarily be greater. This difference in thermal resistance is minimized in accordance with the present invention by utilizing a surface area dimension (footprint) for the metal core 12 and soft gap filler layer 14 which is substantially larger than the surface area of the heat source 20 contacting the phase change material 16. This results in extending the area of heat transfer from the heat source 20 beyond the perimeter of the heat source 20 and minimizes the thermal contact resistance between the heat source 20 and heat sink.

In theory since the heat from the heat source first passes through the thin phase change layer 16, and then enters into the metallic core, by extending the area of the core metallic layer 12 and the soft gap filler layer 14 beyond the area of the heat source the heat will spread laterally in the flat plane of the body of metal core 12 due to the high thermal conductivity of the metallic core 12. After the heat passes through the metallic core 12, it will move through the layer of soft gap filler material 14 and since this layer is also extended beyond the perimeter of the die, there is a greater area for heat transfer to occur. This solution is an improvement over the use simply of a soft gap filler by itself or one which does not have an increased surface dimension and compensates for an otherwise greater thermal resistance as a result of the soft gap filler having an increased thickness. Since the thermal conductivity of this composite is much lower than that of the metallic core, spreading of heat is unfeasible through use of a gap filler which is not of expanded surface dimension. This is easy to explain through the use of the equation for heat transfer in which heat transfer increases proportionally with area and inversely with thickness. Fourier's Law of Heat Conduction is expressed by the following equation:

$$q = -kA(dT/dx)$$

where q is the heat transfer rate, k is a constant called thermal conductivity, and dT/dx is the temperature gradient in the direction of heat flow.

A material having phase change properties shall mean for purposes of the present invention a low melting metal or metal alloy composition or low melting polymer or filled polymer having a melting temperature between 40° C. and 160° C. The preferred low melting material alloy of the present invention should be selected from the group of elements consisting of indium, bismuth, tin, lead, cadmium, gallium, zinc, silver and combinations thereof. An optimum low melting alloy composition of the present invention comprises at least between 10 wt %–80 wt % indium and 20 wt %–50 wt % bismuth with the remainder, if any, selected from the above identified group of elements. The preferred polymer composition is wax or a resin filled with a thermally conductive filler such as boron nitride, aluminum oxide, aluminum, zinc oxide, or other known thermally conductive fillers.

Experimental Results

The effectiveness of spreading heat by extending the area of heat transfer beyond the perimeter of the heat source was substantiated by the following experiments as shown in the accompanying Table 1.

Three layer structures were formed in which a typical melting alloy or polymeric phase change material was applied to the center area of a 51×51 mm by 0.21 mm thick copper core. The area covered by the phase change material (T-faze manufactured by Thermagon, Inc) was 16×16 mm, or just greater than the area of the heat source. A soft 51×51 mm by 1 mm thick gap filler, T-flex 600 manufactured by Thermagon, Inc., was applied the other side of the copper core. This 3 layer structure (FIG. 1) was placed between a 14×14 mm heat source and a 57×57 mm heat sink under a pressure of 5 psi. The heat source was powered with 38.5 watts of power. The temperature difference between heat source and heat sink under constant power was measured. For comparison, similar structures with smaller outside dimensions (16×16 mm) were prepared. Results shown in Table 1 show the effectiveness of heat spreading, in that the larger area samples demonstrated lower temperature differ ential between heat source and heat sink. In another set of experiments the polymeric "T faze" material was replaced by a metal alloy phase change material. In both sets of experiments, the reduced temperature differential between the heat source and heat sink demonstrates the effect of improved thermal transfer.

TABLE 1

| Copper core and Gap Filler size (area available for spreading heat) | Phase change area footprint | Phase Change Material | Temp of Heat source ° C. | Temp of Heat Sink ° C. | Temperature Differential ° C. | Thermal Resistance ° C.*in²/W |
|---|---|---|---|---|---|---|
| 16 × 16 mm - (No copper core) | None | None | 94.8 | 41.5 | 53.3 | 0.407 |
| 16 × 16 mm | 16 × 16 mm | T-faze | 98 | 40.2 | 58.2 | 0.440 |
| 25.4 × 25.4 mm | 16 × 16 mm | T-faze | 71.5 | 40.1 | 31.4 | 0.230 |
| 50.8 × 50.8 mm | 16 × 16 mm | T-faze | 66.2 | 40.5 | 25.7 | 0.195 |
| 16 × 16 mm | 16 × 16 mm | T-lma | | | | |
| 25.4 × 25.4 | 16 × 16 mm | T-lma | | | | |
| 50.8 × 50.8 | 16 × 16 mm | T-lma | 71.4 | 39.8 | 31.6 | .26 |

What we claim is:

1. A free standing thermal interface structure for placement between a heat source and heat sink spaced up to 300 mils apart comprising a plurality of layers including a core body of high conductivity metal or metal alloy having opposite sides, a soft thermal interface layer disposed on one side of the core body for mounting against the heat sink and a thin layer of a phase change material disposed on the opposite side of the core body for mounting against the heat source wherein the surface area dimension (footprint) of the core body is substantially larger than the surface area of the heat source upon which the phase change material is mounted to minimize the thermal resistance between the heat source and the heat sink and wherein said soft thermal interface layer is of a thickness substantially greater than the thickness of said layer of phase change material to accommodate a variable spacing between the heat source and the heat sink of up to 300 mils.

2. A thermal interface structure as defined in claim 1 wherein said soft thermal interface layer is of a composition which is compressible or deflectable such that when squeezed it will allow for thickness tolerance differences between the heat source and heat sink.

3. A thermal interface structure as defined in claim 2 wherein said soft thermal interface layer is composed a polymer filled with a thermally conductive filler.

4. A thermal interface structure as defined in claim 3 wherein said layer of phase change material has a thickness of no greater than 25 mils.

5. A thermal interface structure as defined in claim 4 wherein said layer of phase change material has a thickness of less than 2 mils.

6. A thermal interface structure as defined in claim 4 wherein said layer of phase change material is selected from the group consisting of a low melting metal, metal alloy composition, polymer or filled polymer composition having a melting temperature between 40° C. and 160° C.

7. A thermal interface structure as defined in claim 6 wherein said layer of phase change material is a metal or metal alloy selected from the group of elements consisting of indium, bismuth, tin, lead, cadmium, gallium, zinc, silver and combinations thereof.

8. A thermal interface structure as defined in claim 6 wherein said layer of phase change material is a polymer composition composed of a wax or a resin filled with a thermally conductive filler selected from the group consisting of boron nitride, aluminum oxide, aluminum and zinc oxide.

* * * * *